(12) United States Patent
Gronbeck et al.

(10) Patent No.: US 8,373,241 B2
(45) Date of Patent: *Feb. 12, 2013

(54) ANTIREFLECTIVE HARD MASK COMPOSITIONS

(75) Inventors: Dana A. Gronbeck, Westfield, MA (US); Amy M. Kwok, Sturbridge, MA (US); Chi Q. Truong, Westborough, MA (US); Michael K. Gallagher, Hopkinton, MA (US); Anthony Zampini, Westborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/582,673

(22) Filed: Oct. 20, 2009

(65) Prior Publication Data

US 2010/0297539 A1    Nov. 25, 2010

Related U.S. Application Data

(63) Continuation of application No. 11/512,140, filed on Aug. 29, 2006, now Pat. No. 7,605,439.

(60) Provisional application No. 60/712,305, filed on Aug. 29, 2005.

(51) Int. Cl.
*H01L 21/76* (2006.01)
(52) U.S. Cl. .................. 257/437; 438/99; 257/E21.259
(58) Field of Classification Search .................... 257/40, 257/437, E21.259; 438/72, 99
See application file for complete search history.

(56) References Cited

U.S. PATENT DOCUMENTS

| 4,652,610 | A | * | 3/1987 | Dowbenko et al. | 525/100 |
| 7,605,439 | B2 | * | 10/2009 | Gronbeck et al. | 257/437 |

* cited by examiner

*Primary Examiner* — Quoc Hoang
(74) *Attorney, Agent, or Firm* — Peter F. Corless; Darryl P. Frickey; Edwards Wildman Palmer LLP (57) ABSTRACT

The invention includes new organic-containing compositions that can function as an antireflective layer for an overcoated photoresist. Compositions of the invention also can serve effectively as a hard mask layer by exhibiting a sufficient plasma etch selectivity from an undercoated layer. Preferred compositions of the invention have a high Si content and comprise a blend of distinct resins.

7 Claims, 1 Drawing Sheet

(hard mask of Example 13)
102nm/215nm, 28.5mJ/cm²

FIG. 1A (hard mask of Example 13)
102nm/215nm, 28.5mJ/cm$^2$

FIG. 1B (hard mask of Example 14)
106nm/219nm, 27mJ/cm$^2$

ANTIREFLECTIVE HARD MASK COMPOSITIONS

The present application is a continuation of U.S. application Ser. No. 11/512,140 filed Aug. 29, 2006 now U.S. Pat. No. 7,605,439, which claims priority of U.S. provisional application No. 60/712,305 filed Aug. 29, 2005, both of which applications are incorporated herein by reference.

The invention includes new organic-containing compositions that can function as an antireflective layer for an overcoated photoresist. Compositions of the invention also can serve effectively as a hard mask layer by exhibiting a sufficient plasma etch selectivity from an undercoated layer. Preferred compositions of the invention have a high Si content and comprise a blend of distinct resins.

In the manufacture of semiconductor devices, a variety of conductive device regions and layers are formed on the device substrate, generally segregated by electrically insulating regions, which may be an inorganic or organic dielectric material. Inorganic dielectric regions may be formed e.g. from silicon dioxide and produced by various techniques, e.g. oxide growth, sputtering or other chemical deposition procedures. In the manufacture of the device, it is necessary to make openings in the dielectric layers to permit contact and electrical communication between different regions of the device.

Photolithography is employed to form such apertures in dielectric layers. A photoresist is patterned over the dielectric layer and the dielectric regions bared upon exposure are removed by a dry etch, typically, a plasma etch or ion bombardment.

However, resist mask also may degrade during the plasma etch of the underlying dielectric material, reducing resolution of the image patterned into the dielectric layer. Such imperfect image transfer can only compromise performance of the semiconductor device.

Certain materials known as hard masks have been interposed between dielectric and resist layers to reduce imperfections in image transfer from the resist layer to the underlying dielectric layer. See, for example, U.S. Pat. No. 6,890,448. The hard mask material is deposited onto the dielectric layer. A photoresist is then coated and imaged over the hard mask. The inorganic hard mask regions bared upon resist development are removed by a plasma etch to which the organic resist layer is resistant. Relatively high etch selectivity can be achieved between the hard mask layer and the overcoated patterned organic-based resist. Such etch selectivity is generally not possible between a dielectric layer and an organic-based resist. Upon such etching, the hard mask profile matches the resist mask. Dielectric regions exposed upon hard mask etching now can be removed by an etch that is selective for the dielectric and for which the hard mask is resistant. Because high etch selectively can be realized between the dielectric layer material and the hard mask, image transfer imperfections as discussed above can be avoided.

While such an approach can be effective for the manufacture of many integrated circuits, industry demands continue produce even smaller features at higher resolution. Indeed, other problems in circuit manufacture that can limit resolution and the ability to form ever smaller features. For instance, reflection of activating radiation used to expose a photoresist can limit resolution of the image patterned in the resist. In particular, reflection of radiation from the underlying surface/photoresist interface can produce spatial variations in the radiation intensity in the photoresist, resulting in non-uniform photoresist linewidth upon development. Exposure radiation also can scatter from the underlying surface/photoresist interface into regions of the photoresist coating where exposure is not intended, again resulting in linewidth variation.

It thus would be desirable to have new compositions and methods for integrated circuit manufacture.

Preferred coating compositions of the invention are suitable for use as an antireflective coating composition for an overcoated photoresist. Preferred compositions of the invention also can serve effectively as a hard mask layer by exhibiting a sufficient plasma etch selectively to an undercoated layer (e.g. an inorganic oxide or an organic layer) and an overcoated photoresist.

It should be understood that references herein to a composition of the invention as a hard mask are not limiting and composition of the invention may be applied over a variety of organic and inorganic coatings (including but not limited to dielectric layers) as well as onto a substrate surface such as a semiconductor wafer without any type of interposed inorganic or organic coating.

Particularly preferred compositions of the invention comprises a mixture of distinct resins, wherein the mixture includes at least one resin that has silicon content and at least one resin distinct from the Si-resin that has chromophore groups that can effectively absorb radiation employed to expose an overcoated photoresist layer. By stating that a resin is distinct from an Si-resin, the differences will include the chemical composition of the resin with respect to the Si-resin and the differences will not be limited solely to molecular weight. For instance, a distinct resin may not have any Si-content.

In a particular preferred aspect, compositions of the invention comprise a resin with high Si content which is mixed with an organic resin that comprises exposure radiation-absorbing chromophores. Chromophore groups are typically aromatic groups such as optionally substituted phenyl, optionally substituted naphthyl or optionally substituted anthracenyl.

In another particular aspect, compositions of the invention may comprise a resin with Si content as well as chromophore units which is blended with an organic resin that may or may not comprise exposure radiation-absorbing chromophores, such as optionally substituted phenyl, optionally substituted naphthyl or optionally substituted anthracenyl.

Preferred compositions of the invention have high silicon content, e.g. at least about 20 weight percent silicon based on total weight of all composition solids (all components except solvent carrier), more preferably least about 25, 30 or 35 weight percent silicon based on total weight of all composition solids. It has been found that particularly good results (including etch selectivity) can be achieved where the composition has from about 25 to 45 weight percent silicon based on total weight of all composition solids, more preferably from about 28 to 40 or 45 weight percent silicon based on total weight of all composition solids, even more preferably from about 30 to 38 weight percent silicon based on total weight of all composition solids.

We found that compositions that contain only a single type of single resin (i.e. no mixture of distinct resins) having Si content and chromophore groups may not consistently provide optimal lithographic results. In particular, we found that compositions that employ a single resin having Si content and chromophore groups may result in a non-straight profile of an overcoated developed photoresist relief image, with footing of the developed resist reliefimage being especially notable.

We then surprisingly found that good resist profile control and absence or essential absence of undesired footing of an overcoated resist relief image can be realized with an under-coating composition of the invention that contains a high Si content mixture of at least two distinct resins as disclosed herein.

Preferred for use in compositions of the invention are Si resins that comprise the silicate formula $SiO_2$ as a resin repeat unit. Among other things, such resin repeat units can impart high silicon content to the resin and a composition containing the resin.

Such $SiO_2$ repeat units can be provided e.g. by polymerizing compounds of the formula $Si(Y)_4$ where each Y is the same or different and are each reactive groups (e.g. leaving groups) toward a hydrolysis or condensation reaction, such as alkoxy (e.g. $C_{1-3}$alkoxy) or halogen such as chloro, bromo or iodo.

Generally preferred Si-resins for use in a composition of the invention include siloxanes and silsesquioxanes, which may have organic content.

As discussed above, compositions of the invention also contain a component that comprises one or more chromophore groups that can effectively absorb exposure radiation used to pattern an overlying resist layer. The optimal chromophore can vary with the exposure wavelength employed for the overcoated photoresist. For instance, for a resist imaged at 248 nm, the composition may suitably contain a resin or other component that has optionally substituted anthracene or optionally substituted naphthyl groups. For a resist imaged at 193 nm, the composition may suitably contain a resin or other component that has optionally substituted phenyl or optionally substituted naphthyl groups.

Compositions of the invention also preferably are crosslinked (any type of hardening including bond-forming reactions) during processing. Preferred compositions of the invention may be thermally crosslinked prior to applying an overcoated photoresist composition.

In a particular aspect, compositions of the invention do not contain an added acid source, such as acid or acid generator compound (e.g. thermal acid generator or photoacid generator compound).

In another particular aspect, compositions of the invention do contain an added acid source, such as acid or acid generator compound, e.g. thermal acid generator or photoacid generator compound, with a thermal acid generator compound being preferred.

The invention also includes methods for patterning and treating a substrate, particularly an electronic packaging device such as a semiconductor wafer and the like.

More particularly, a preferred method of the invention includes (i) providing a substrate (e.g. a semiconductor wafer) having a dielectric surface layer (organic or inorganic) or other underlayer such as an antireflective layer, planarizing layer, fill material and (ii) applying such as by spin-coating an organic composition of the invention over the coated substrate.

A photoresist layer is then applied over or above the organic composition of the invention and the resist layer is imaged to patterned radiation and developed to provide a relief image over the hard mask layer. The organic composition of the invention (hard mask) then may be etched with a plasma that is more reactive with the hard mask than the overcoated resist relief image, e.g. an etch selectively of antireflective hard mask:photoresist relief image of at least about 1.1:1, more preferably at least about 1.3:1, still more preferably at least about 1.4:1 or 2:1. Many hard mask compositions of the invention can be conveniently selectively etched with a fluorine-based plasma. Alternatively, preferred hard mask compositions may be removed by wet processing such as with an aqueous fluoride stripper composition.

That etch treatment provides a relief image of the hard mask composition that corresponds to that of the overlaying patterned resist. If an inorganic or organic layer lies beneath the hard mask composition, those bared underlying composition areas then can be etched with a plasma that is comparatively less reactive with the hard mask layer, e.g. an etch selectively of underlying layer:hard mask layer of at least about 3:1, more preferably at least about 5:1, still more about at least about 10:1, 12:1, 15:1 or 20:1 or more. For instance, an organic layer could be selectively etched with an oxygen-based plasma, and the hard mask layer can be etched with a halide plasma such as a fluorine or chlorine plasma. Such underlying composition areas also can be removed with a wet stripper composition. Substrate areas bared upon such etching or other removal of the underlayer layer then can be selectively processed as desired, e.g. metallized.

The invention further provides novel articles of manufacture comprising substrates such as a microelectronic wafer coated with a hard mask composition of the invention alone or in combination with an overcoated photoresist composition and/or an underlying dielectric layer.

A variety of photoresists may be used in combination (i.e. overcoated) with a hard mask composition of the invention. Preferred photoresists for use with hard mask compositions of the invention are chemically-amplified resists, especially positive-acting photoresists that contain one or more photoacid generator compounds and a resin component that contains units that undergo a deblocking or cleavage reaction in the presence of photogenerated acid, such as photoacid-labile ester, acetal, ketal or ether units. Negative-acting photoresists also can be employed with hard mask compositions of the invention, such as resists that crosslink (i.e. cure or harden) upon exposure to activating radiation. Preferred photoresists for use with a hard mask composition of the invention may be imaged with relatively short-wavelength radiation, e.g. radiation having a wavelength of less than 300 nm or less than 260 nm such as about 248 nm, or radiation having a wavelength of less than about 200 nm, such as 193 nm.

Hard mask compositions of the invention also are useful in immersion lithography imaging systems.

Other aspects of the invention are disclosed infra.

FIG. 1 (includes FIGS. 1A and 1B) shows SEMs of a developed photoresist relief images over a hard mask compositions, as detailed in Example 31 which follows.

As discussed above, organic hard mask compositions are provided that can function as an antireflective layer for an overcoated photoresist. Preferred compositions of the invention have a high Si content and comprise a mixture of at least two distinct resins.

Preferred hard mask compositions of the invention are organic compositions that can be spin-coated (i.e. spin-on composition) onto substrate and comprise one or more resins containing silicon substitution (i.e. an Si-resin) and a chromophore component which may be polymeric or non-polymeric and comprises groups that can effectively absorb radiation employed to expose an overcoated photoresist layer such as aromatic moieties including optionally substituted phenyl, optionally substituted naphthyl and optionally substituted anthracenyl. The chromophore component may be the Si-resin (i.e. the Si-resin may have covalently bound chromophore groups such as may be provided by polymerization of an Si-anthracene, Si-naphthylene or Si-phenyl monomer), or the chromophore component may be the distinct resin of the composition resin blend (i.e. the distinct resin may have covalently bound chromophore groups), or the composition may contain a yet further component which may be non-polymeric and contain chromophore groups.

Preferred hard mask compositions have a relatively high silicon content, e.g. where the hard mask composition has silicon present in an amount of at least 20 weight percent based on weight of total solids of the hard mask composition (all components except solvent carrier), and more preferably the hard mask composition has silicon present in an amount of at least 25, 26, 27, 28, 29, 30, 31, 32, 33, 34, 35, 36, 37 or 38 weight percent based on weight of total solids of the hard mask composition. Suitable hard mask compositions also may have even higher amounts of silicon, e.g. where the hard mask composition has silicon present in an amount of at least 40 or 45 weight percent based on weight of total solids of the hard mask composition.

Si-Resin of Resin Mixture:

Compositions of the invention include at least one resin that comprises silicon atoms.

Preferred Si-resins of the invention have a relatively high Si content, as discussed above. In particular, resins that contain $SiO_2$ repeat units are preferred. Such $SiO_2$ repeat units can be provided by polymerizing compounds of the formula $Si(Y)_4$ where each Y is the same or different and are each reactive groups (e.g. leaving groups) toward a hydrolysis or condensation reaction, such as alkoxy (e.g. $C_{1-3}$alkoxy) or halogen such as chloro, bromo or iodo. Tetraethylorthosilicate (TEOS) is a preferred reagent. Halogen-substituted silicon reagents also are useful.

Additional preferred Si resins for use in compositions of the invention comprise repeat units that in combination have an SiO formula of $SiO_{1.5<x<2}$ (e.g. at least a portion such as at least 10, 20, 30, 40, 50, 60, 70, 80 or 90 percent of total repeat units of the resin has such a SiO formula) and/or where the entire resin has an SiO formula of $SiO_{1.5<x<2}$.

Suitable Si-resins for use in compositions of the invention may comprise repeat units as shown in the following Formulae (I) and (II):

wherein in those formulae R, $R^1$ and $R^2$ are hydrogen or non-hydrogen substituents such as those discussed above, and m, n, x, y and z are each greater than zero.

In Formula I above, the values of m and n suitably may vary rather widely. For instance, suitably m (i.e. number percent of $[Si(R)O_{3/2}]$ repeat units in the polymer based on total polymer units) is from 2 to 90 or 95 percent, more typically from 5 to 30, 40, 50, 60, 70 or 80 percent of the total number of polymer repeat units, with the balance of polymer units being $SiO_2$ repeat units, or other units. Thus, in turn, in Formula I, suitably n (i.e. number percent of $[SiO_2]$ repeat units in the polymer based on total polymer units) is from 2 to 90 or 95 percent, more typically from 10 to 15, 20 30, 40, 50, 60, 70, 80 or 85 percent based on the number of total polymer repeat units, with the balance of polymer units being $Si(R)O_{3/2}$ repeat units, or other units.

Similarly, in Formula II above, the values of x, y and z suitably may widely vary. For instance, suitably the sum of x and y (i.e. number percent of $[Si(R^1)O_{3/2}]$ and $[Si(R^2)O_{3/2}]$ repeat units in the polymer based on total polymer units) is the same as discussed for m immediately above, and values for z are suitably the same as discussed for n immediately above. The respective values of x and y can vary widely, e.g. x and y suitably may each be from 2 to 80 percent based on total polymer units, more typically x and y suitably may be 5 to 10, 15, 20, 30, 40, 50, 60 or 70 percent based on total polymer units.

Such high Si content resins can be readily synthesized. Preferred syntheses include a condensation or hydrolysis reaction under acidic or basic conditions.

In general, one or more reactive Si reactants such as those of the above discussed of the formula $Si(Y)_4$ are reacted in the presence of acid or base and water with one or more other reactants preferably in a suitable organic solvent for a time sufficient to form the desired polymer. The reaction can be run at elevated temperatures as needed to promote polymerization e.g. at 50° C., 70° C., 80° C. or 90° C. or higher. Preferably, one or more organic solvents are used, e.g. an ether, ketone or aromatic solvent such as acetone, propylene glycol methyl ether acetate, glyme, toluene, xylenes and the like. The amount of water is typically present in an amount of a molar equivalent or excess relative to the leaving group(s) on the Si reactant (e.g. a reactant of the formula $Si(Y)_4$ as discussed above). If base is employed, the base may be an organic or inorganic reagent. Good results have been obtained with organic bases such as triethylamine, dicyclohexylamine and the like. The base is suitably present in a molar equivalent or excess relative to the Si reagent. Good results also have been obtained using acid-protmoted reactions, e.g. using an inorganic or organic acid such as HCl, malonic acid and/or oxalic acid.

In general, a molar excess of water and base or acid and elevated reaction temperatures can be employed to promote or enhance polymerization.

Preferred polymers of the invention include those that are formed from polymerization of a silyl halide or silyl alkoxide, including trihalo and trialkoxy compounds such as those of the formula R—Si($OC_{1-3}$alkoxy)$_3$ e.g. R—Si($OCH_2CH_3$)$_3$ or R—Si(halide)$_3$ e.g. R—Si(Cl)$_3$, as well as mixed alkoxyhalosilanes such as RSi(Cl)$_2$(OR) and RSi(OR)$_2$Cl. The R moiety on such compounds suitably may be aromatic (e.g. phenyl or naphthyl) or more preferably non-aromatic such as an optionally substituted alkyl or alicyclic groups such as norbornyl, adamantyl or the like. Such R groups may be substituted by a photoacid-labile group e.g. acid-labile ester such as t-butyl ester or acetal group, or an acetal group, or by aqueous base-solubilizing groups such as a fluorinated alcohol, sulfonamide, thiol, or the like. Such groups may be further substituted with electron-withdrawing groups such as fluorine, cyano, etc.

A preferred co-reactant with such trihalo or trialkoxy or mixed tri(halo/alkoxy) reactants is a tetrafunctional (4 leaving groups) reactant such as a tetraalkoxysilane that can react to provide $SiO_2$ units in the formed polymer, whereas the such trihalo or trialkoxy or mixed tri(halo/alkoxy) reactants provides $Si(R)O_{3/2}$ polymer units.

Specifically suitable Si reactants include tetraethoxysilane, tetrapropoxysilane, triethoxychlorosilane ($SiCl(Et)_3$), and hexachlorodislane.

We also have found the hydrolysis and condensation reactions of tetrafunctional Si organic reactants such as tetraalkoxysilanes proceed at rates significantly faster than those of large, steric hindered trialkoxy organic silanes such as hexafluoroisopropanol norbonyl(HFIPNB)-triethoxysilane. Such reactivity differences can result in producing polymers with large molecular weight distributions containing multiple distinct molecular components. Gelation of the reaction mixture also can occur with reaction of large, steric hindered reactants such as large trialkoxy organic silanes.

We have further found that such wide molecular weight distribution and gelation can be avoided if the triethoxysilane co-reactant R group is a relatively small alkyl e.g. of 1 to 12 carbon atoms (with no branches on the α-carbon) and that do not sterically inhibit or slow down the hydrolysis or condensation reactions. Examples of such an R group include fluoroalcohols such as 1,1,1-trifluoro-2-trifluoromethyl-pent-4-en-2-ol (BTHB)-triethoxysilane, 1,1,1-trifluoro-2-trifluoromethyl-pent-4-en-2-ol-ethoxy methyl ether-triethoxysilane, (1,1-bis-trifluoromethyl-but-3-enyloxy)-acetic acid tert-butyl ester (BTHBTBAC)-triethoxysilane, triethoxysilane of 3-trifluoromethyl-3-hydroxy-1-propene, and non fluoroalcohols such 2,2,2-trifluoroethyl-triethoxysilane or triethoxysilane of 2,2,2-trifluoroethyl ethylether. Abbreviations for certain substituent groups are used herein, including the following: TFAMNBB designates 2-trifluormethyl-bicyclo[2.2.1]hept-5-ene-2-carboxylic acid tert-butyl ester; BTHB designates 1,1,1-trifluoro-2-trifluoromethyl-pent-4-en-2-ol; BTHBTBAC designates (1,1-bis-trifluoromethyl-but-3-enyloxy)-acetic acid tert-butyl ester; and EOM designates ethoxyl methyl ether.

We have further found that reactants with such small R groups are favored to produces the discrete polymer particles of the invention. That is, the small R group containing trialkoxysilanes can condense with a tetraalkoxysilane to form dense, highly cross-linked, soluble, film-forming polymer structures (particles) that with appropriate substituents (e.g. photoacid-labile ester or acetal groups) can be photo-imaged as a photoresist composition. The formation of these particles can be catalyzed either by acid or base, preferably under strong base catalysis at elevated temperatures. See Examples 16 and 18 of U.S. Patent Application 2004/0248032 for exemplary syntheses of Si-resin particles.

The Si-resin also may contain a variety of other groups, e.g. solubilizing groups such as ester, nitrile and other polar groups that may facilitate formation of a uniform organic solvent-based spin-on composition.

Also, as discussed above, the Si-resin may contain chromophore groups, particularly optionally substituted aromatic groups such as optionally substituted phenyl, optionally substituted naphthyl and/or optionally substituted anthracenyl groups.

Chromophore Component and Distinct Resin of Composition:

As discussed above, compositions of the invention also contain a component that contains one or more chromophore groups that can effectively absorb radiation employed to image an overcoated photoresist layer.

While the Si-resin may contain chromophore groups, it is generally preferred that chromophore groups are present on an additional composition component. In particular embodiments, the one or more resins distinct from the one or more Si-resins suitably may contain chromophore groups.

As discussed above, chromophore groups typically are aromatic groups and in general are carbocyclic aryl groups such as optionally substituted phenyl (particularly for an overcoated photoresist imaged at 193 nm), optionally substituted naphthyl (particularly for an overcoated photoresist imaged at 193 nm or 248 nm), or optionally substituted anthracene (particularly for an overcoated photoresist imaged at 248 nm).

Generally preferred chromophore components include resins that may include chromophore units as components of a resin backbone, or as groups pendant to a resin backbone.

Such chromophore resins suitably may have a variety of backbone structures. For example, suitable chromophore resins include polyesters, polyacrylates, polysulfones, polyamides, poly(vinylalcohols), styrenics, and the like. Particularly preferred are chromophore resins include polyester resins, poly(acrylate) and styrenic resins.

Such polyester, polyacrylate, polysulfone, polyamide, poly(vinylalcohol) and styrenic resins also may be suitable distinct resins (i.e. distinct from the Si-resin component) of organic compositions of the invention even if the resins do not contain any chromophore groups. A wide variety of resins can serve as distinct resin components, including a wide variety of resins that do not contain Si-content. Preferred distinct resins include those that are compatible (e.g. same chemical type or structure) with resin systems of an overcoated photoresist layer. For instance, if the overcoated photoresist contains an acrylate resin, it may be preferred to employ an acrylate-containing polymer as at least one of the distinct resins of an underlying composition of the invention.

Preferred polyester chromophore resins may be provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like. Preferably, an ester functionality is present as a component of, or within, the polymer backbone rather than as a pendant or side chain unit. Ester moieties also may be present as a pendant group, but preferably the polymer also contains an ester functionality along the polymer backbone. Also preferred is where the ester repeat unit comprises aromatic substitution, such as optionally substituted carbocyclic aryl groups e.g. optionally substituted phenyl, naphthyl or anthracenyl substitution, either as a side chain or more preferably along the polymer backbone.

It will be understood that in such polyester resins at least certain of the ester groups are not photoacid-labile, i.e. the ester repeat units do not undergo deblocking or other cleavage during typical lithographic processing of pre-exposure bake, exposure to activating radiation, post-exposure heating, and/or development. Preferably, ester repeat units are present in the polymer backbone, i.e. the ester groups (—(C=O)O—) are present on the branched or substantially linear chain that forms the polymer length. Also preferred is that such ester groups contain aromatic substitution, e.g. a phenyl, naphthyl or anthracene group, such as may be provided by reaction of a an alkyl phthalate with a polyol.

Such a polyester resin may contain other repeat units, either as pendant or side chain units, or as other repeat units along the polymer backbone. For example, the resin may be a copolymer (e.g. two distinct repeat units along resin backbone), terpolymer (e.g. three distinct repeat units along resin backbone), tetrapolymer (e.g. four distinct repeat units along polymer backbone) or pentapolymer (e.g. five distinct repeat units along polymer backbone). For instance, suitable will be polymers that contain ether and ester repeat units, or alkylene repeat units together with ester and ether units. Additional repeat units that contain one or more oxygen atoms are preferred for many applications.

Exemplary preferred resins that may be utilized in coating compositions of the invention include those that are formed by reaction of a compound that contains one or more carboxyl (e.g. ester, anhydride, carbocyclic acid) groups together with a compound that contains one or more hydroxy group preferably at least two hydroxy groups. The carboxyl-containing compound also preferably may contain two or more carboxyl (—C=OO—) groups. The carboxyl and hydroxy compound are suitably reacted in the presence of acid, optionally with other compounds If copolymer or other higher order polymer is desired, to thereby provide a polyester resin.

Such polyester resins are suitably prepared by charging a reaction vessel with the a polyol, a carboxylate compound, and other compounds to be incorporated into the formed resin, an acid such as a sulfonic acid, e.g. methane sulfonic acid or para-toluene sulfonic acid, and the like. The reaction mixture is suitably stirred at an elevated temperature, e.g. at least about 80° C., more typically at least about 100° C., 110° C., 120° C., 130° C., 140° C., or 150° C. for a time sufficient for polymer formation, e.g. at least about 2, 3, 4, 5, 6, 8, 12, 16, 20, 24 hours. Exemplary preferred conditions for synthesis of useful resins are detailed in the examples which follow.

As mentioned, acrylate-based polymers also are chromophore resins for use in compositions of the invention. Such resins can be prepared by known methods, such as polymerization (e.g. in the presence of a radical initiator) of one or more acrylate monomers such as e.g. hydroxyethylmethylacrylate, hydroxyethylacrylate, methylmethacrylate, butyl methacrylatemethylanthracene methacrylate or other anthracene acrylate and the like. See U.S. Pat. No. 5,886,102 assigned to the Shipley Company for exemplary suitable polymers. See also the examples which follow for suitable acrylate resins and syntheses thereof.

Suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in an antireflective composition employed with a photoresist imaged at sub-200 nm wavelengths such as 193 nm. Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Also, in addition to or in place of a chromophore resin, compositions of the invention may contain a non-polymeric compound that contains one or more chromophore groups such as optionally substituted phenyl, optionally substituted anthracene, optionally substituted naphthyl, or other aromatic group.

Suitably, resins (e.g. Si-resins and distinct resins which may have chromophore groups) of compositions of the invention will have a weight average molecular weight (Mw) of about 1,000 to about 10,000,000 daltons, more typically about 2,000 to about 100,000 daltons or more, and a number average molecular weight (Mn) of about 500 to about 1,000,000 daltons. Molecular weights (either Mw or Mn) of the resins are suitably determined by gel permeation chromatography.

Hard Mask Compositions:

As mentioned above, preferred hard mask compositions of the invention can be crosslinked, e.g. by thermal and/or radiation treatment.

Preferred hard mask compositions can be crosslinked without the inclusion of a separate crosslinker or acid source. Thus, suitable hard mask compositions of the invention may only contain one or more Si-resins and one or more chromophore components and solvent carrier, where the Si-resin(s) and chromophore component(s) can react to crosslink (harden) upon thermal treatment.

If desired, compositions of the invention also may contain one or more separate crosslinker components and one or more acid sources to enhance or promote crosslinking.

More particularly, suitable compositions of the invention may contain as separate components: one or more Si resins, one or more chromophore components, and/or one or more crosslinkers, and/or an acid or acid generator compound such as a thermal acid generator compound.

If utilized, a variety of acids or acid generators may be employed in a compositions of the invention. Thermal acid generators often may be preferred, e.g. an ammonium arenesulfonate salt. Typically, if employed, one or more thermal acid generators are present in a hard mask composition in a concentration from about 0.1 to 10 percent by weight of the total of the dry components of the composition (all components except solvent carrier), more preferably about 2 percent by weight of the total dry components.

If utilized, a variety of crosslinkers may be employed, including those crosslinkers disclosed in Shipley European Application 542008. For example, suitable crosslinkers include amine-based crosslinkers such as melamine materials, including melamine resins such as manufactured by Cytec Industries and sold under the tradename of Cymel 300, 301, 303, 350, 370, 380, 1116 and 1130. Glycolurils are particularly preferred including glycolurils available from Cytec Industries. Benzoquanamines and urea-based materials also will be suitable including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Hard mask compositions of the invention also other optional components such as additional dye compounds that absorb radiation used to expose an overcoated photoresist layer. Other optional additives include surface leveling agents, for example, the leveling agent available under the tradename Silwet 7604 available from GE Silicones OSi Specialties, or the surfactant FC 171 or FC 431 available from the 3M Company.

Hard mask compositions of the invention also may optionally contain small amounts (e.g. 1 or 2 weight percent or less based on total solids) of a complexing acid such as a difunctional organic acid which can improve shelf life of the composition. Malonic acid is a preferred stabilizing acid to employ in a composition of the invention.

The one or more Si-resins and one or more chromophore components may be present in a composition of the invention in a variety of amounts. Suitably, the one or more Si-resins are present in a significant amount relative to the one or more chromophore components. For example, the one or more chromophore components may be suitably present in a composition in a weight ratio of chromophore component:Si resin of about 5:20 to about 60:40, more typically about 1:10 to about 50:50.

To make a liquid hard mask composition of the invention, composition components are dissolved in a suitable solvent such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of a hard mask composition varies from about 0.5 to 20 weight percent of the total weight of the hard mask composition, preferably the solids content varies from about 2 to 10 weight of the hard mask composition.

Exemplary Photoresist Systems

A variety of photoresist compositions can be employed with hard mask compositions of the invention, including positive-acting and negative-acting photoacid-generating compositions. Photoresists used with hard mask compositions of the invention typically comprise a resin binder and a photoactive component, typically a photoacid generator compound. Preferably the photoresist resin binder has functional groups that impart alkaline aqueous developability to the imaged resist composition.

Particularly preferred photoresists for use with hard mask compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793.

Hard mask compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying hard mask composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, and iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Suitable photoacid generators to employ in a positive or negative acting photoresist overcoated over a hard mask composition of the invention include imidosulfonates such as compounds of the following formula:

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctane-sulfonyl)oxy]-5-norbornene-2,3-dicarboximide.

Sulfonate compounds are also suitable PAGs for resists overcoated a hard mask composition of the invention, particularly sulfonate salts. Two suitable agents for 193 nm and 248 nm imaging are the following PAGS1 and 2:

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresist used with hard mask compositions of the invention.

A preferred optional additive of photoresists overcoated a hard mask composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Preferred negative-acting resist compositions for use with a hard mask composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

Photoresists for use with a hard mask composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 50 percent by weight of the total weight of a resist's dry components.

Various substituents and materials (including resins, small molecule compounds, acid generators, etc.) as being "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl, etc; and the like.

Lithographic Processing

In use, a substrate may be employed that suitably may be overcoated with an inorganic or organic dielectric layer, or other inorganic or organic coating such as a polarizing layer, an antireflective layer, a fill material such as a gap fill or via fill, or the substrate may not be overcoated prior to application of a hard mask composition of the invention. The substrate may be e.g. an electronic packaging device such as a semiconductor wafer, microchip module and the like. For example, substrate may be a silicon, silicon dioxide, aluminum or aluminum oxide microelectronic wafer. Other substrates that may be employed include gallium arsenide, gallium nitride, indium-based, ceramic, quartz or copper substrates. A dielectric layer if present may be e.g. an inorganic oxide e.g. $SiO_2$, resin layer such as parylene or a fluorinated amphorous carbon, or any of a variety of materials employed to segregate and electrically insulate features of the processed substrate.

A hard mask composition of the invention then may be applied over any underlayer, if such underlayer is present. In one preferred application method, the hard mask composition may be applied by spin coating a liquid coating formulation over the substrate over dielectric layer or other underlayer if present, followed by removal of the solvent carrier such as by vacuum hotplate at about 90° C. for 60 seconds. The hard mask composition in general may be suitably applied on a substrate with a dried layer thickness of between about 0.02 and 0.5 μm more typically a dried layer thickness of between about 0.04 and 0.20 μm.

Preferably the applied hard mask composition is cured before a photoresist composition is applied over the antireflective composition. Cure conditions will vary with the components of the antireflective composition, particularly the Si-resin and chromophore component. Typical cure conditions are from about 80° C. to 225° C. for about 0.5 to 40 minutes. Cure conditions preferably render the coating composition coating layer substantially insoluble to the photoresist solvent as well as an alkaline aqueous developer solution.

After such curing, a photoresist is applied above the surface of the hard mask composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the hard mask composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. Preferred exposure radiation wavelengths include sub-300 nm such as 248 and sub-200 nm such as 193 nm. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The photoresist layer also may be dry developed with a plasma (e.g. oxygen-based plasma) if desired.

In further processing, the applied hard mask composition may be patterned with a plasma distinct from the plasma (if employed) to form the overlying resist relief images. For instance, antireflective hard mask layer can be etched with a halide-based plasma such as a fluorine or chlorine-based plasma to provide antireflective hard mask relief images that correspond to the overlying resist relief images. A preferred material to etch an applied hard mask composition of the invention is a plasma formed in a gas flow of $CF_3$, preferably in the substantial (less than 3 or 5 molar %) absence of oxygen.

Thereafter, if present, a dielectric layer underlying the hard mask composition can be etched e.g. by an oxygen-based plasma which removes resist relief images and dielectric layer not masked by patterned antireflective hard mask layer, which is resistant to the oxygen-based plasma because of the inorganic component (Si) of that layer.

The selectively defined surface of substrate (e.g. semiconductor wafer) can then be processed as desired, e.g. the defined areas can be metallized such as by vapor deposited copper, aluminum, tungsten, or other conductive metal, or alloys thereof to provide circuit traces or electrical interconnect vias. A preferred metal to form vias or traces is CVD copper, or electroplated copper.

The following non-limiting examples are illustrative of the invention.

EXAMPLES 1-6

Syntheses of Chromophore Components

Example 1

Synthesis of Chromophore Resin

STY : HEMA Structure

To a 500 mL, 3 neck round bottom flask equipped with a condenser, thermometer, magnetic stirrer and external oil heating bath, was added the following: Styrene (STY) (38.20 g, 0.367 mol), 2-hydroxyethyl methacrylate (HEMA) (31.81 g, 0.244 mol). Propylene glycol monomethyl ether acetate (PGMEA) (190 mL) was added and the resulting solution heated to 100° C. Once at reflux, a 10 wt % solution of initiator 2,2'-azobis-2-methylbutyronitrile (AMBN) (9.4 g, 0.049 mol) in PGMEA was added. The solution was held for 90 minutes at 100° C., after which another charge of initiator solution (10 wt %) was added to the flask (2.55 g, 0.012 mol). The solution was held at for an additional 6.5 hours at 100° C. and then cooled to ambient. This yielded about 370 g of polymer as an approximately 19 wt % solids solution in PGMEA. The produced polymer is also described in Table 1 which follows Table 1 below.

Examples 2-6

Additional Chromophore Polymer Syntheses

By the same procedures disclosed for Example 1 but with appropriate modification of amounts of charging monomers, reaction times (longer reaction times to provide high molecular weights), and the like, an additional five polymers were produced (those five polymers are polymers of Examples 2 through 6 respectively). Characteristics of those polymers of Examples 2 through 6 are set forth in Table 1 immediately below.

TABLE 1

Polymer Characterization

| Example | Polymer Description | Target Composition (mol %) | Mw | PD |
|---|---|---|---|---|
| 1 | STY/HEMA | 60/40 | 3260 | 1.71 |
| 2 | STY/HEMA | 60/40 | 9602 | 2.17 |
| 3 | STY/HEMA | 90/10 | 3620 | 1.84 |
| 4 | STY/HEMA | 80/20 | 3631 | 1.77 |
| 5 | STY/HEMA | 60/40 | 3314 | 1.72 |
| 6 | STY/HEMA | 60/40 | 5265 | 1.89 |

Examples 7-10

Synthesis of Si Polymers

General Comments:

In the following Examples 7-10, all glassware was acid washed. Phenyltriethoxysilane (PhSQ), methyl triethoxysilane (MSQ) and tetraethyl orthosilicate (TEOS) were obtained from Aldrich. All monomers were used without further purification. Propylene glycol methyl ether acetate (referred to herein as "PGMEA") was electronics grade. 0.1N HCl and malonic acid were also obtained from Aldrich. Malonic acid was sublimed (115° C. at <1 mm Hg) and then further purified by ion exchange with IRN-77.

In the following Examples 7-10, Phenyltriethoxysilane is referred to as (PhSQ; methyl triethoxysilane is referred to as MSQ; and tetraethyl orthosilicate is referred to as TEOS. Numerical values following a polymer indicate the molar percent of the specified polymerized monomer unit in the polymer, e.g. PhSQ/MSQ/TEOS Oct. 30, 1960 of Examples 7 below specifies a polymer that has 10 mole percent polymerized phenyltriethoxysilane; 30 mole percent polymerized methyl triethoxysilane; and 60 mole percent polymerized tetraethyl orthosilicate.

Example 7

Synthesis of PhSQ/MSQ/TEOS 10/30/60 Terpolymer

A 1 L 3 neck round bottom flask equipped with a thermometer, condenser, nitrogen inlet, and magnetic stirrer was charged with 50.0 g (0.28 mol) of MSQ, 22.5 g (0.09 mol) of PhSQ and 116.8 g (0.56 mol) of TEOS. After stirring for 5 min., 60.1 g of DI $H_2O$, and 0.55 g of 0.100N HCl water solution was added to the RB. The catalyst concentration was around 10 ppm. The cloudy mixture became clear in 2.5 hours. Then it was heated to 85° C. and held overnight (about 13 hr).

The reaction mixture was cooled to room temperature. Catalyst was removed by passing the polymer solution through a column charged with conditioned IRN-150 IX resin. 200 g of PGMEA was added to the polymer solution. EtOH and $H_2O$ were removed under reduced pressure (rotary evaporator) at 30° C. for about 1 hr. The reaction mixture was then pumped on (~4 mm Hg at 25° C.) for an additional 1 hr. to remove any additional water and ethanol. Metals were removed via IRN-150 IX column. 0.2 um PTFE filter used to remove large particles. The resulting polymer solution was adjusted to 20% percent solids. GPC analysis showed that the polymer had an Mw of 34,000, an Mn of 3,300. The final product was stabilized with 1000 ppm malonic acid and stored at −20° C.

Example 8

Synthesis of PhSQ/MSQ/TEOS 10/54/36

A 1 L 3 neck round bottom flask equipped with a thermometer, condenser, nitrogen inlet, and magnetic stirrer was charged with 100.0 g (0.56 mol) of MSQ, 24.97 g (0.10 mol) of PhSQ and 77.9 g (0.37 mol) of TEOS. After stirring for 5 min., 60.2 g of DI $H_2O$, and 0.73 g of 0.100N HCl water solution was added to the RB. The catalyst concentration was around 10 ppm. The cloudy mixture became clear in 1.5 hours. Then it was heated to 85° C. and held overnight (about 13 hr).

The reaction mixture was cooled to room temperature. Catalyst was removed by passing the polymer solution through a column charged with conditioned IRN-150 IX resin. 200 g of PGMEA was added to the polymer solution. EtOH and $H_2O$ were removed under reduced pressure (rotary evaporator) at 30° C. for about 1 hr. The reaction mixture was then pumped on (~4 mm Hg at 25° C.) for an additional 1 hr. to remove any additional water and ethanol. Metals were removed via IRN-150 IX column. 0.2 um PTFE filter used to remove large particles. The resulting polymer solution was adjusted to 20% percent solids. GPC analysis showed that the polymer had an Mw of 3,030, an Mn of 1,373. The final product was stabilized with 1000 ppm malonic acid and stored at −20° C.

Example 9

Synthesis of PhSQ/MSQ/TEOS 10/70/20

A 1 L 3 neck round bottom flask equipped with a thermometer, condenser, nitrogen inlet, and magnetic stirrer was charged with 100.0 g (0.56 mol) of MSQ, 19.3 g (0.08 mol) of PhSQ and 33.4 g (0.16 mol) of TEOS. After stirring for 5 min., 45.9 g of DI $H_2O$, and 0.27 g of 0.100N HCl water solution was added to the RB. The catalyst concentration was around 10 ppm. The cloudy mixture became clear in 1.5 hours. Then it was heated to 85° C. and held overnight (about 13 hr).

Reaction work-up was similar to that of Example 7 above. The resulting polymer had an Mw of 2,693, an Mn of 1,350. The final product was stabilized with 1000 ppm malonic acid and stored at −20° C.

Example 10

Synthesis of PhSQ/MSQ 10/90

A 1 L 3 neck round bottom flask equipped with a thermometer, condenser, nitrogen inlet, and magnetic stirrer was charged with 150.0 g (0.84 mol) of MSQ and 22.5 g (0.09 mol) of PhSQ. After stirring for 5 min., 50.3 g of DI $H_2O$, and 0.20 g of 0.100N HCl water solution was added to the round bottom flask. The catalyst concentration was around 10 ppm. The cloudy mixture became clear in 1.5 hours. Then it was heated to 85° C. and held overnight (about 13 hr).

Reaction work-up was similar to that of Example 7 above. The resulting polymer had an Mw of 1,870, an Mn of 1,120. The final product was stabilized with 1000 ppm malonic acid and stored at −20° C.

Example 11

Contact Angle and Strip Tests 4.5% solids in PGMEA solutions of each of the polymers of Examples 7 through 10 above were prepared. Thin films were obtained by spin-coating the polymer solutions onto four-inch wafers at 1500 rpm and then baked at 250° C. for 1 minute. The thin films were then subjected to contact angle test (H₂O) and strip tests using PGMEA and 0.26N TMAH solution, respectively. The results were summarized in table 1. All the thin films were around 600 to 800 Å after bake. "−" represents loss of thickness and "+" gain of thickness.

TABLE 1

Contact Angle and Film Strip Tests

|  | Contact Angle (°) | PGMEA Strip (Å) | 0.26N TMAH (Å) |
|---|---|---|---|
| Polymer of Example 7 | 62 | +4 | +47 |
| Polymer of Example 8 | 72 | +3 | Did not test |
| Polymer of Example 9 | 73 | +6 | +32 |
| Polymer of Example 10 | 78 | −15 | +10 |

Example 12

Additional Polymer Syntheses

A number of polymeric aromatic samples having one or more chromophores for a variety of wavelengths, such as 248 nm, 193 nm and 157 nm were prepared.

These samples were combined with a variety of methyl silsesquioxanes ("MeSQ") with varying molecular weights as shown in Table 2 below.
MeSQ=Methylsilsesquioxanes
PhSQ=Phenylsilsesquioxanes
BTESE=Bistriethoxysilylethane
TEOS=Tetraethylorthosilicate

TABLE 2

| MeSQ | Matrix | Mw (Daltons) |
|---|---|---|
| Polymer 1 | 54/46 MeSQ/TEOS | 5000 |
| Polymer 2 | 10/30/60 PhSQ/MeSQ/TEOS | 31000 |
| Polymer 3 | 10/54/36 PhSQ/MeSQ/TEOS | 3000 |
| Polymer 4 | 10/70/20 PhSQ/MeSQ/TEOS | 2700 |
| Polymer 5 | 20/46/34 PhSQ/MeSQ/BTESE | 5000 |
| Polymer 6 | 33/33/34 PhSQ/MeSQ/BTESE | 5000 |

The aromatic samples are reported in Table 3 below. Monomers used to prepare the aromatic sample along with the monomer weight ratio, based on the total weight of the monomers used.
Styrene=Sty
Hydroxyethylmethylmethacrylate=HEMA
Methylmethacrylate=MMA
n-Butylmethacrylate=nBMA
Polyhydroxystyrene=pHS
Acetoxystrene=Asty
2-hydroxymethylacrylic acid ethyl ester=EHMA

TABLE 3

| Aromatic sample | Matrix | Mw (Daltons) |
|---|---|---|
| Polymer 7 | Sty/HEMA/MMA/nBMA (30/38/31/1) | 5000 |
| Polymer 8 | Sty/HEMA (60/40) | 3000 |
| Polymer 9 | Sty/HEMA (60/40) | 96000 |
| Polymer 10 | pHS/Sty (50/50) | 4000 |

TABLE 3-continued

| Aromatic sample | Matrix | Mw (Daltons) |
|---|---|---|
| Polymer 11 | ASty/HEMA (60/40) | 5300 |
| Polymer 12 | ASty/HEMA (60/40) | 13000 |
| Polymer 13 | Sty/HEMA/MMA/nBMA (30/50/191) | 12000 |
| Polymer 14 | Sty/HEMA/MMA/nBMA (50/35/14/1) | 80000 |
| Polymer 15 | EHMA/MMA (50/50) | 20000 |
| Polymer 16 | PPEGPEA/HEMA/TMPTMA (80/10/10) | 18000 |

Example 13

Additional Polymer Syntheses

Poly(styrene-co-hydroxyethyl methacrylate-co-methylmethacrylate-co-n-butyl methylmethacrylate) was prepared as follows:

All reagents were initially charged into the reactor with little regard to the order of addition. The reaction setup consists of a 1 L three-neck, round-bottom flask fitted with a mechanical stirrer, temperature control box, temperature probe, heating mantle, condenser, nitrogen and vacuum inlet. The reaction flask was quenched in liquid nitrogen and reaction solution was purged with nitrogen for 15 minutes. The reaction mixture was heated to 67° C. and stirred under reflux for 24 hours. The polymer was precipitated with overhead stirring, vacuum-filtered, and dried at 55° C. under vacuum. GPC was performed on all polymer samples as indicated in Table 2.

Charge: styrene (40.12 g, 0.3852 mol), hydroxyethyl methacrylate (63.33 g, 0.4866 mol), methyl methacrylate (41.06 g, 0.4101 mol), n-butyl methylmethacrylate (1.98 g, 0.0139 mol), Vazo 52 (22.26 g, 7 mol %) and THF (587 g). The polymer solution was precipitated into 8000 mL of distilled water, yield 98%, Mw/Mn=5115/2819.

Example 14-30

Preparation of Hard Mask Compositions

A variety of blends of aromatic chromophore resins and Si-resins were prepared. Each of those resin blends is detailed in Table 4 below. Aromatic resins (chromophore resins) were combined with Si-resins at different loadings of aromatic resins and such loading levels are reported in below in percent by weight.

The blends were prepared by charging the indicated components into a clean bottle without regard to order of charge into a solvent of propylene glycol methyl ether acetate to provide about a 95 weight percent solution. The samples were shaken or placed on rollers until completely dissolved. Each sample was then passed through a 0.2 μm PTFE membrane filter into a clean bottle.

Following Table 4, further details of the hard mask compositions of Examples 16, 17, 22, 24, 25, 26 and 27 are set forth.

TABLE 4

| Blend Example | Aromatic resin | Si-resin | Aromatic % |
|---|---|---|---|
| 14 | Sty/HEMA/MMA/nBMA (30/38/31/1) | Example 7 | 30 |
| 15 | Sty/HEMA/MMA/nBMA (30/38/31/1) | Example 7 | 40 |

TABLE 4-continued

| Blend Example | Aromatic resin | Si-resin | Aromatic % |
|---|---|---|---|
| 16 | Sty/HEMA/MMA/nBMA (30/38/31/1) | Example 7 | 50 |
| 17 | Sty/HEMA/MMA/nBMA (30/38/31/1) | Example 7 | 70 |
| 18 | Sty/HEMA (60/40), 3000 daltons | Example 7 | 15 |
| 19 | Sty/HEMA (60/40), 3000 daltons | Example 7 | 10 |
| 20 | Sty/HEMA (60/40), 9600 daltons | Example 7 | 15 |
| 21 | pHS/Sty (50/50), 4000 daltons | Example 7 | 30 |
| 22 | pHS/Sty (50/50), 4000 daltons | Example 7 | 15 |
| 23 | Sty/HEMA/MMA/nBMA (30/38/31/1) | Example 8 | 10 |
| 24 | Sty/HEMA/MMA/nBMA (30/50/19/1) | Example 8 | 10 |
| 25 | Sty/HEMA/MMA/nBMA (50/35/14/1) | Example 8 | 10 |
| 26 | Sty/HEMA (60/40), 3000 daltons | Example 8 | 15 |
| 27 | Sty/HEMA (60/40), 3000 daltons | Example 8 | 10 |
| 28 | Sty/HEMA (60/40), 3000 daltons | Example 8 | 5 |
| 29 | Sty/HEMA (60/40), 3000 daltons | Example 9 | 10 |
| 30 | Sty/HEMA (60/40), 3000 daltons | Example 10 | 10 |

Preparation of Hard Mask Composition of Example 16:

The polymers of Example 1 and Example 5 were formulated into a silicon containing anti-reflective hard mask composition by mixing together 2.15 wt % of Example 1 and 2.15 wt % of Example 5 and 95.7 wt % propylene glycol methyl ether acetate.

Preparation of Hard Mask Composition of Example 17:

The polymers of Example 1 and Example 5 were formulated into a silicon containing anti-reflective hard mask composition by mixing together 1.29 wt % of each Example 1 and 3.01 wt % of Example 5 and 95.7 wt % propylene glycol methyl ether acetate.

Preparation of Hard Mask Composition of Example 22:

The polymers of Example 1 and Example 8 were formulated into a silicon containing anti-reflective hard mask composition by mixing together 4.59 wt % of Example 1 and 0.81 wt % of Example 8 and 94.6 wt % propylene glycol methyl ether acetate.

Preparation of Hard Mask Composition of Example 24:

The polymers of Example 2 and Example 9 were formulated into a silicon containing anti-reflective hard mask composition by mixing together 4.41 wt % of Example 2 and 0.49 wt % of Example 9 and 95.1 wt % propylene glycol methyl ether acetate.

Preparation of Hard Mask Composition of Example 25:

The polymers of Example 2 and Example 10 were formulated into a silicon containing anti-reflective hard mask composition by mixing together 4.41 wt % of Example 2 and 0.49 wt % of Example 10 and 95.1 wt % propylene glycol methyl ether acetate.

Preparation of Hard Mask Composition of Example 26:

The polymers of Example 2 and Example 6 were formulated into a silicon containing anti-reflective hard mask composition by mixing together 4.165 wt % of Example 2 and 0.735 wt % of Example 6 and 95.1 wt % propylene glycol methyl ether acetate.

Preparation of Hard Mask Composition of Example 27:

The polymers of Example 2 and Example 6 were formulated into a silicon containing anti-reflective hard mask composition by mixing together 5.4 wt % of Example 2 and 0.6 wt % of Example 6 and 94 wt % propylene glycol methyl ether acetate.

Example 31

Lithographic Processing

The hard mask antireflective coatings of Examples 14-30 were spin coated on 200 mm silicon wafers using an ACT8 wafer coating tool, and then cured using a proximity hotplate at 250° C./60 s. Spin speeds were varied as necessary so that the antireflective film thickness after cure was 40-120 nm. Next, a 193 nm photoresist was spin coated on top of the antireflective film, and cured at 110° C./90 seconds to give a 250 nm thick film of photoresist. The photoresist was then exposed through a target mask using a 193 nm ArF wafer scanner with a 0.75 numerical aperture and annular illumination with 0.89/0.60 inner/outer partial coherence. The exposed resist film was given a 110° C./90 sec post-exposure bake and then developed using 2.38% tetramethyl ammonium hydroxide in water developer in a standard 30 second single-puddle process.

Figure 1A:
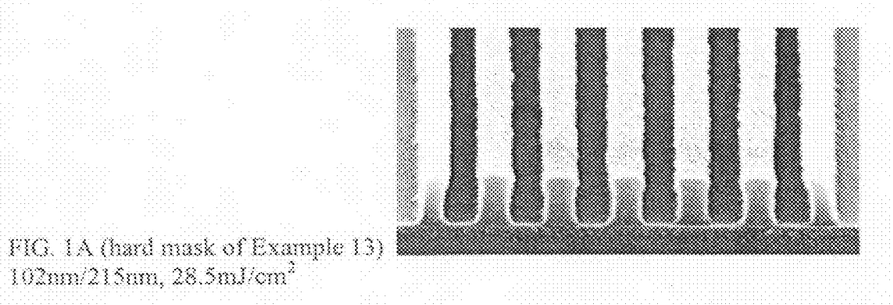
Figure 1B:
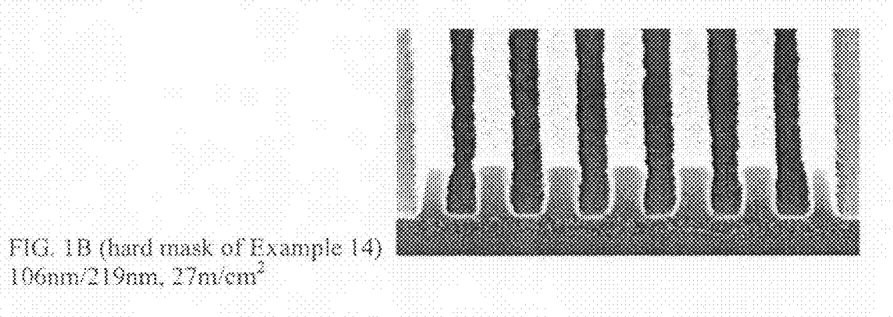

The quality of the resist patterns was examined by scanning electron microscopy (SEM) at 75,000 magnification. The SEM images showed good pattern fidelity with a clean interface between the resist and the silicon containing antireflective layer. The resist pattern was free of "standing wave" artifacts caused by reflective interference phenomena. SEM images of a 110 nm 1:1 line:space resist pattern over the antireflective coating of Examples 16 and 17 are shown in FIGS. 1A and FIG. 1B respectively.

The foregoing description of this invention is merely illustrative thereof, and it is understood that variations and modifications can be made without departing from the spirit or scope of the invention as set forth in the following claims.

What is claimed is:

1. A coated substrate comprising:
    (a) an organic antireflective composition comprising:
        (i) one or more Si-resins;
        (ii) one or more resins distinct from the one or more Si-resins, the one or more distinct resins comprising a polyester resin that comprises optionally substituted phenyl groups,
    wherein the organic composition having Si content having Si content of at least 20 weight percent based on total solids of the composition; and
    (b) a photoresist layer over the antireflective layer.

2. The substrate of claim 1 wherein the organic composition has a Si content of at least 30 weigh percent based on total solids of the composition.

3. The substrate of claim 1 wherein the one or more Si-resins is obtainable by reaction of one or more reagents of the firmula $Si(Y)_4$ where each Y is the same or different and are each reactive groups.

4. A method of forming or treating a microelectronic substrate, comprising:
    (a) applying an organic antireflective composition on a substrate, the organic composition comprising (i) one or more Si-resins and (ii) one or more resins distinct from the one or more Si-resins, the one or more distinct resins comprising a polyester that comprises optionally substituted phenyl groups,
    wherein the organic composition having Si content of at least 20 weight percent based on total solids weight of the composition;
    (b) applying a photoresist layer above the applied organic antireflective composition.

5. The method of claim 4 wherein the organic antireflective composition has a Si content of at least 30 weight percent based on total weight of the composition.

6. The method of claim 4 wherein the organic antireflective composition does not contain an acid or acid generator compound.

7. The method of claim 4 wherein the organic antireflective composition is crosslinked prior to applying the photoresist layer.

* * * * *